(12) United States Patent
Albrecht

(10) Patent No.: US 10,330,753 B2
(45) Date of Patent: Jun. 25, 2019

(54) OUTPUT COMBINATION OF TRANSISTORS IN AN MRT RADIO-FREQUENCY POWER AMPLIFIER

(71) Applicant: Adam Albrecht, Nürnberg (DE)

(72) Inventor: Adam Albrecht, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 696 days.

(21) Appl. No.: 14/971,093

(22) Filed: Dec. 16, 2015

(65) Prior Publication Data

US 2016/0178715 A1 Jun. 23, 2016

(30) Foreign Application Priority Data

Dec. 19, 2014 (DE) .................. 10 2014 226 664

(51) Int. Cl.
*G01V 3/00* (2006.01)
*G01R 33/36* (2006.01)
(52) U.S. Cl.
CPC .................. *G01R 33/3614* (2013.01)
(58) Field of Classification Search
CPC ................................................. G01R 33/3614
USPC ................................................. 324/322, 318
See application file for complete search history.

(56) References Cited

U.S. PATENT DOCUMENTS 5,491,415 A * 2/1996 Holmes ............ G01R 33/34007
324/318
8,049,563 B2 * 11/2011 Aoki ........................ H03F 1/223
330/276

8,618,802 B2 * 12/2013 Albrecht ............ G01R 33/3614
324/322
2005/0127914 A1 6/2005 Eberler et al.
2012/0187951 A1 7/2012 Albrecht et al.
2013/0076359 A1 3/2013 Albrecht

FOREIGN PATENT DOCUMENTS

DE          10314215 B4      11/2006
DE        102010032077 A1     1/2012
DE        102011006061 A1     9/2012

OTHER PUBLICATIONS

German Office action for related German Application No. 10 2014 226 664.5, dated Oct. 13, 2015, with English Translation.

* cited by examiner

*Primary Examiner* — Louis M Arana
(74) *Attorney, Agent, or Firm* — Lempia Summerfield Katz LLC

(57) ABSTRACT

A power electronic unit for an amplifier of an imaging magnetic resonance tomography (MRT) system is provided. The power electronic unit includes at least one printed circuit board, on which a plurality of transistors are arranged. Ports (e.g., drain and source) of the plurality of transistors are connected together by electrically conductive connections, and the plurality of transistors are all arranged on one side of the at least one printed circuit board. An output line or cable parallel to the connections, at least in sections, runs on the opposing side of the printed circuit board and may be connected or is connected with or without further interconnected elements (e.g., a balun) to transmitting coils of the MRT.

19 Claims, 5 Drawing Sheets

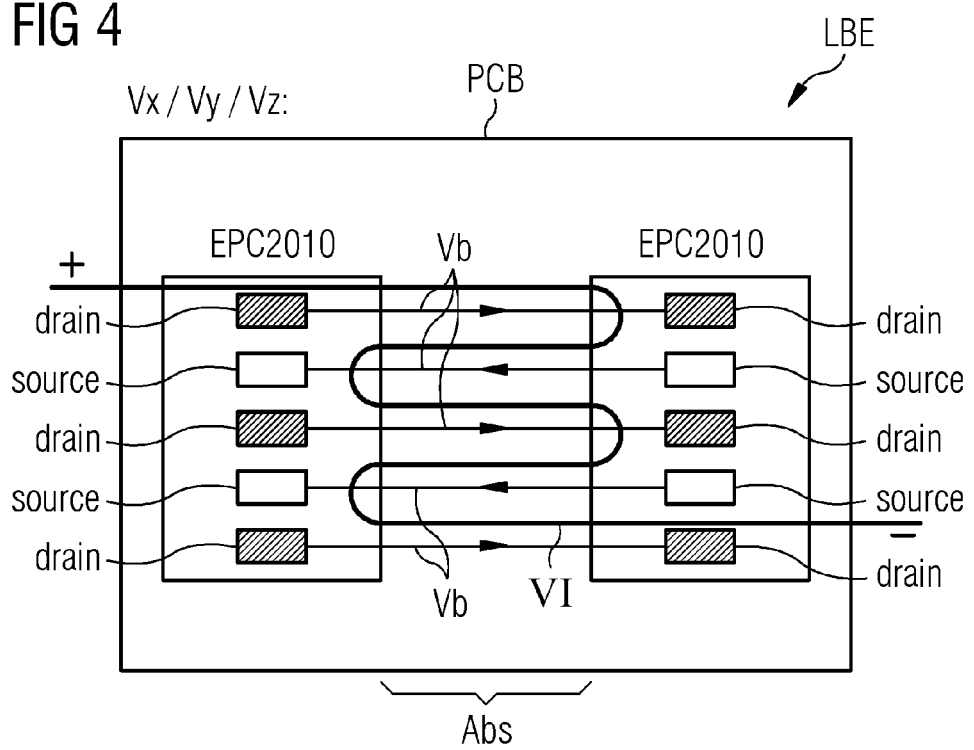

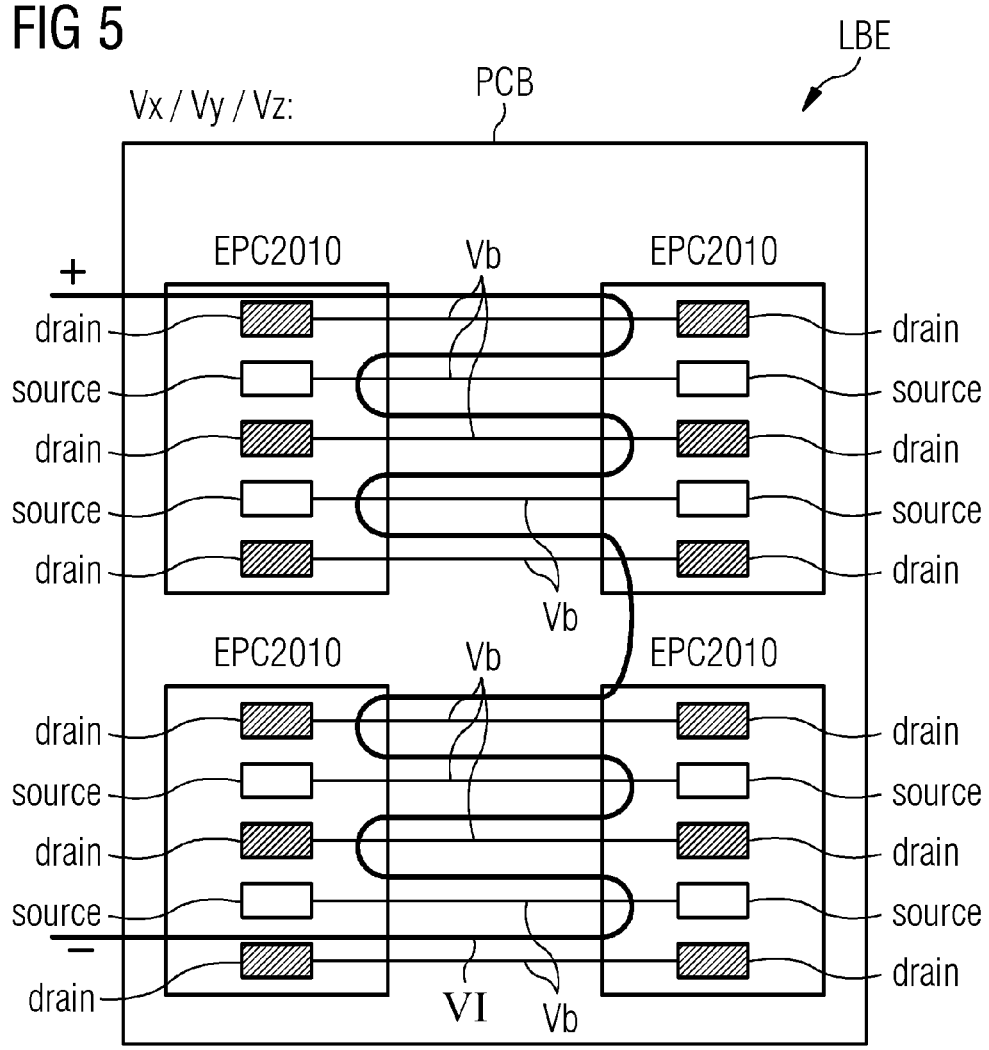

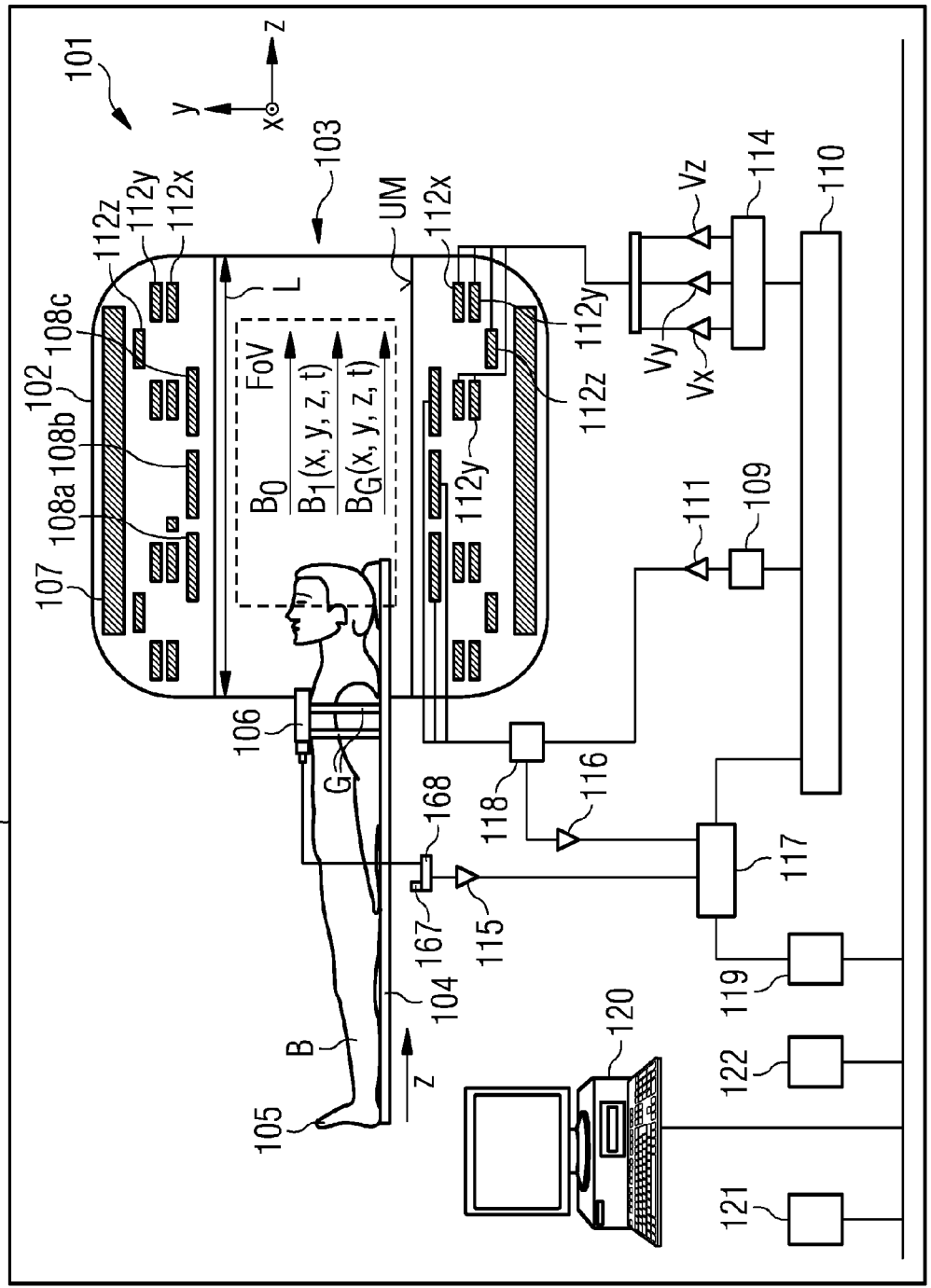

OUTPUT COMBINATION OF TRANSISTORS IN AN MRT RADIO-FREQUENCY POWER AMPLIFIER

CROSS-REFERENCE TO RELATED APPLICATIONS

The present patent document claims the benefit of DE 102014226664.5, filed on Dec. 19, 2014, which is hereby incorporated by reference in its entirety.

TECHNICAL FIELD

The present embodiments relate to a power electronic unit.

BACKGROUND

Magnetic resonance devices (MRTs) for examining objects or patients by magnetic resonance tomography are known, for example, from DE 103 14 215 B4.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a high frequency (HF) amplifier arrangement (e.g., for an MRT) is optimized.

One or more of the present embodiments may enable a very compressed HF amplifier arrangement with good impedance matching.

BRIEF DESCRIPTION OF THE DRAWINGS

FIG. 4 depicts a through-view of the top and bottom of one embodiment of a circuit board having two assemblies on the top with a plurality of transistors, and an output line or cable on the bottom that runs parallel at least in sections to the connections.

FIG. 5 depicts a through-view of the top and bottom of one embodiment of a circuit board having four assemblies on the top with a plurality of transistors, and an output line or cable on the bottom that runs parallel at least in sections to the connections.

FIG. 6 schematically depicts an MRT system.

DETAILED DESCRIPTION

Figure 1:
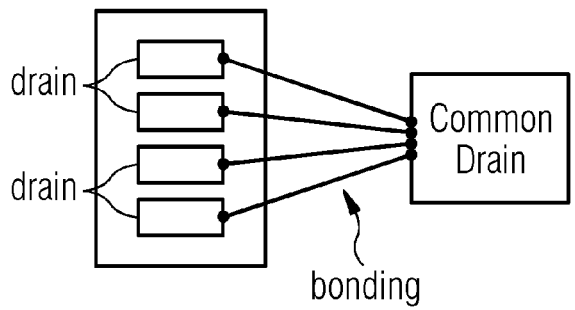
FIG. 1 depicts a plan view of a connection of outputs of a plurality of transistors by a shared common drain bonding.

FIG. 6 depicts an imaging magnetic resonance device MRT 101 (e.g., located in a shielded space or Faraday cage F), having a hollow cylinder 102 with, for example, a tubular space 103 in which an examination table 104 with a body 105 (e.g., of an examination object, such as that of a patient; with or without local coil arrangement 106) may be moved in the direction of the arrow z to generate recordings of the patient 105 by an imaging method. Arranged on the patient 105 is a local coil arrangement 106 with which a local region (e.g., the Field of View or FoV) of the MRT recordings of a section of the body 105 in the FoV may be generated. Signals of the local coil arrangement 106 may be evaluated by an evaluation device (e.g., including elements 168, 115, 117, 119, 120, 121, etc.) of the MRT 101 that may be connected (e.g., by a coaxial cable or by radio (167)) to the local coil arrangement 106 (e.g., converted into images, stored or displayed).

To examine a body 105 (e.g., an examination object or a patient) by magnetic resonance imaging using a magnetic resonance device MRT 101, different magnetic fields that are matched as accurately as possible to each other (e.g., in terms of temporal and spatial characteristics) are irradiated onto the body 105. A strong magnet (e.g., a cryomagnet 107) in a measuring booth having a tunnel-like opening 103, for example, generates a static strong main magnetic field $B_0$ (e.g., amounting to 0.2 tesla to 3 tesla, or more). A body 105 to be examined, positioned on an examination table 104, is moved into a region of the main magnetic field $B_0$ that is substantially homogeneous in the field of observation FoV. The nuclear spins of atomic nuclei of the body 105 are excited by magnetic high-frequency excitation pulses B1(x, y, z, t) that are irradiated by a high-frequency antenna (and/or optionally a local coil arrangement) depicted in very simplified form as a body coil 108 (e.g., a multi-part body coil including 108a, 108b, and 108c). For example, high-frequency excitation pulses are generated by a pulse-generating unit 109 that is controlled by a pulse sequence control unit 110. After amplification by a high-frequency amplifier unit 111, the pulses are led to the high-frequency antenna 108. The high-frequency system is depicted schematically. More than one pulse-generating unit 109, more than one high-frequency amplifier 111, and/or a plurality of high-frequency antennae 108a, 108b, and 108c are potentially used in a magnetic resonance device 101.

The magnetic resonance device 101 also has gradient coils 112x, 112y, 112z with which magnetic gradient fields $B_G$(x, y, z, t) may be irradiated during a scan for selective slice excitation and for spatial encoding of the scan signal. The gradient coils 112x, 112y, 112z are controlled by a gradient coils control unit 114 (and optionally by amplifiers Vx, Vy, Vz) that, like the pulse-generating unit 109, are also connected to the pulse sequence control unit 110.

Signals emitted by the excited nuclear spins (e.g., of the atomic nuclei in the examination object) are received by the body coil 108 and/or at least one local coil arrangement 106, are amplified by associated high-frequency pre-amplifier 116, and are processed further by a receiving unit 117 and digitized. The recorded scan data is digitized and stored as complex numerical values in a k-space matrix. An associated MR image may be reconstructed from the k-space matrix with assigned values by a multi-dimensional Fourier transformation.

For a coil that may be operated in both transmitting and receiving modes, such as, for example, the body coil 108 or a local coil 106, the correct signal forwarding may be regulated by an upstream duplexer 118.

From the scan data, an image processing unit 119 generates an image that is displayed for a user and/or stored in a memory unit 121 via a control console 120. A central arithmetic unit 122 controls the individual system components.

In MR tomography, images with a high signal-to-noise ratio (SNR) are usually made using local coil arrangements (e.g., coils, local coils). Local coil arrangements are antenna systems that are provided in the immediate vicinity on top(anterior), below (posterior),on, or in the body 105. During an MR scan, the excited nuclei induce a voltage in the individual antennae of the local coil. The induced voltage is amplified using a low-noise pre-amplifier (e.g., LNA, Preamp, etc.) and forwarded to the electronic receiving device. High field systems (e.g., 1.5 T-12 T or more) are used to improve the signal-to-noise ratio, even in high-resolution images. If more individual antennae are connected to an MR receiving system than receivers, a switch matrix (e.g., an RCCS) is installed between receiving antennae and receivers. The switch matrix routes the instantaneously active receiving channels (e.g., the receiving channels that are located precisely in the field of view of the magnet) to the existing receivers. As a result, more coil elements may be connected than receivers are present because, in the case of whole-body coverage, only coils located in the FoV or in the homogeneity volume of the magnet are to be read.

Generally, for example, an antenna system, that may include an antenna element or, as an array coil, a plurality of antenna elements (e.g., coil elements) is designated a local coil arrangement 106. For example, the individual antenna elements are configured as loop antennae (loops), butterfly, flex coils or saddle coils. For example, a local coil arrangement includes coil elements, a pre-amplifier, further electronic devices (e.g., sheath wave traps, etc.), a housing, supports and may include a cable with connectors, by which the local coil arrangement is connected to the MRT system. A receiver 168, provided on the system, filters and digitizes a signal received by a local coil 106 (e.g., via radio, etc.), and passes the data to a digital signal processing device that may derive an image or a spectrum from the data obtained by a scan and makes the image or spectrum available to the user (e.g., for subsequent diagnosis and/or storage).

FIG. 1 depicts a plan view of a connection of outputs (e.g., "drain") of a plurality of transistors via a shared common drain (e.g., "bonding" to a "common drain"), according to prior art.

Figure 2:
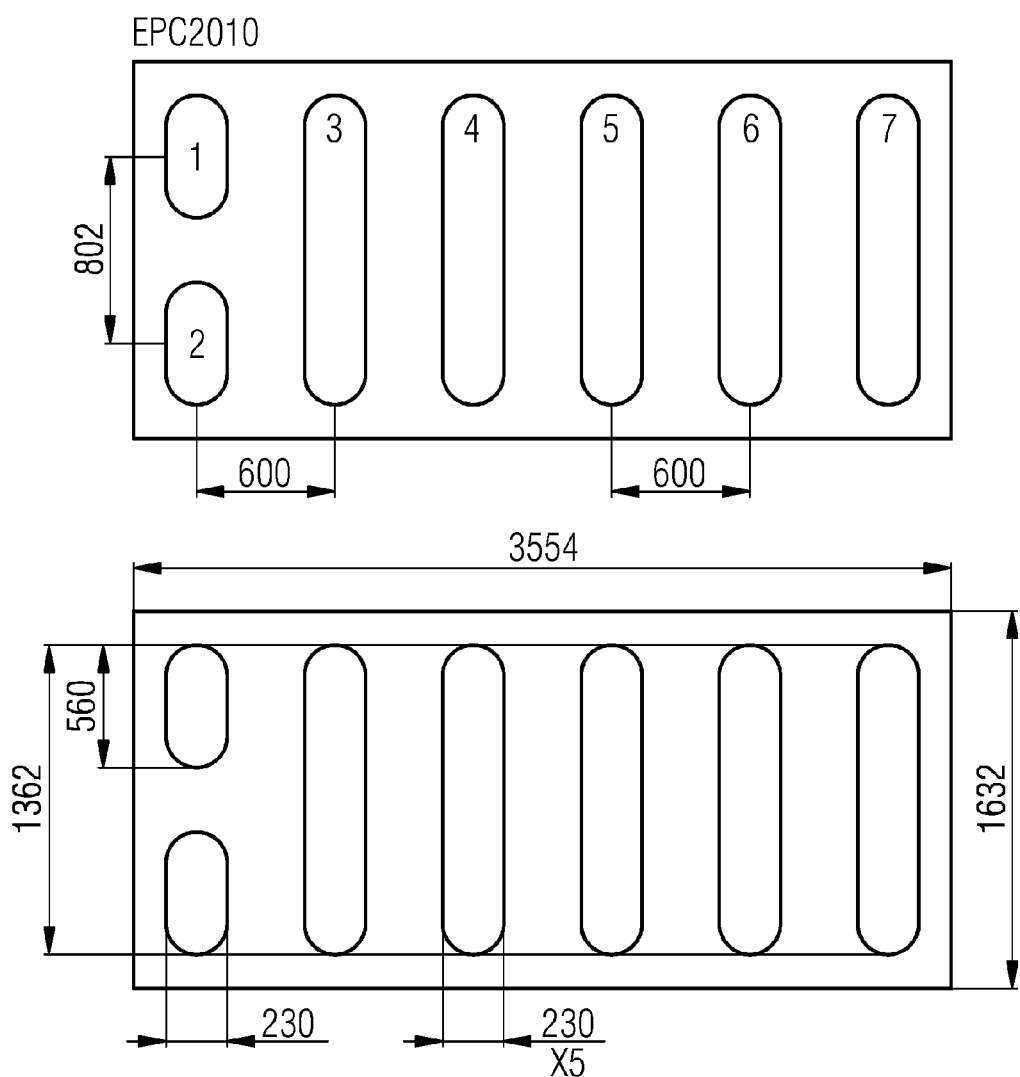
FIG. 2 depicts a plan view of one embodiment of an assembly having a plurality of transistors and dimensions.

FIG. 2 depicts an example of a plan view of an assembly ("EPC2010") including a plurality of transistors. The plurality of transistors include gate input 1, source ports 4 and 6, drain ports 3, 5 and 7, and substrate contact 2. For example, the dimensions may be 802 mm by 1362 mm, with contact widths of 230 mm and contact spacing of 600 mm.

Figure 3:
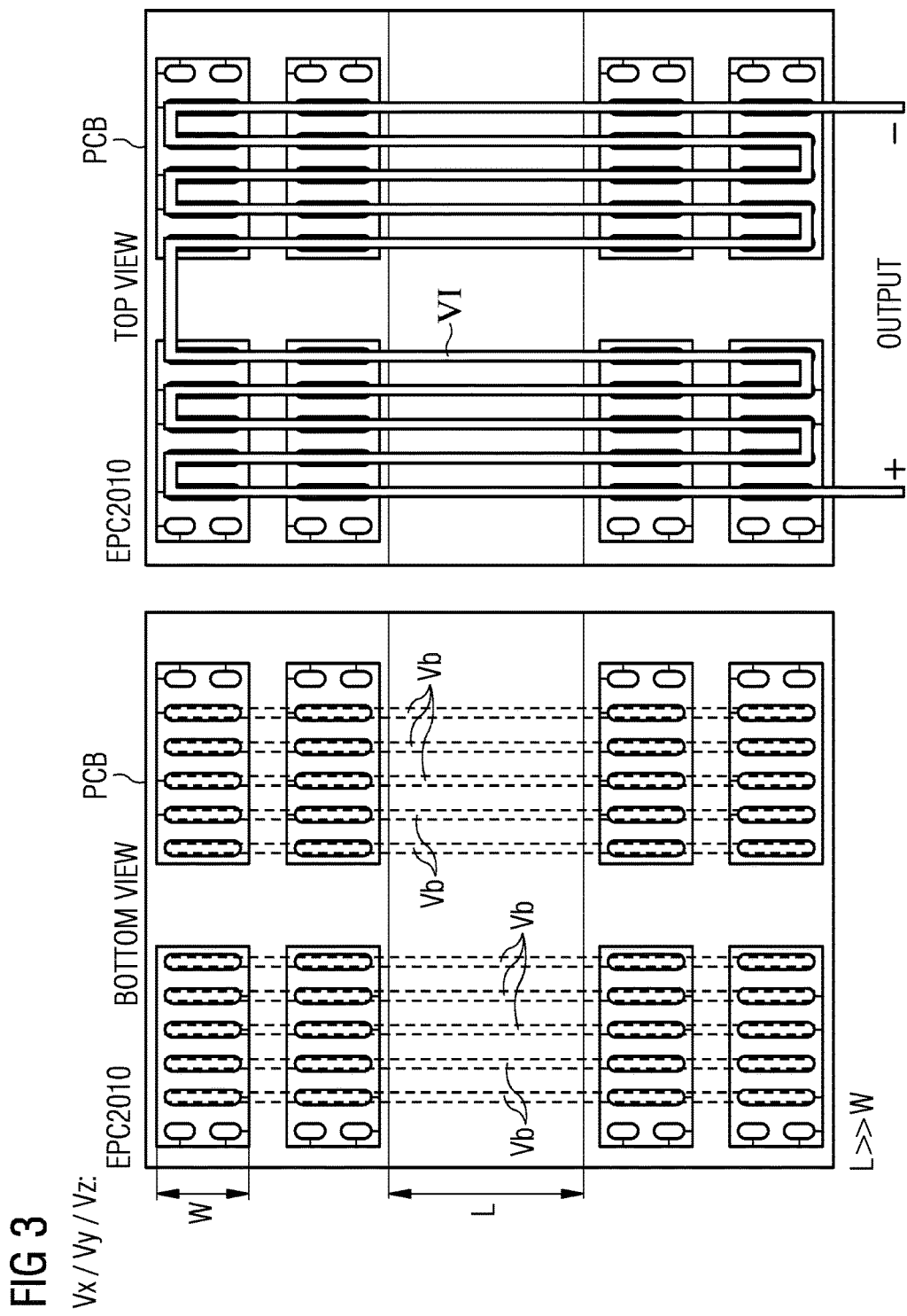
FIG. 3 depicts a plan view one embodiment of a power electronic unit.

FIG. 3 depicts (from below (left) and in a plan view (right)) a power electronic unit (e.g., an amplifier RFPA, Vx, Vy, Vz of an imaging MRT system 101) having, on one (e.g., just one) circuit board side (e.g., bottom), a plurality of assemblies (e.g., EPC2010; each with a plurality of transistors) with drain and source ports connected on the circuit board side by connections Vb (e.g., electrically conductive), and on the other circuit board side (e.g., top side), an output line or cable (e.g., not connected to the circuit board, the transistors or the transistor connections), into which HF energy is coupled, that is transmitted at the output (e.g., +, −, output) in the direction of a transmitting coil (e.g., 108).

FIG. 4 depicts a through-view of the top and bottom of a circuit board having two assemblies (e.g., EPC2010) on the top (e.g., each with a plurality of transistors and/or drain-and-source ports) and an output line or cable Vl that runs parallel at least in sections (e.g., running in five parallel, mutually connected loops from left to right and right to left) to the connections Vb (e.g., running on the other side of the circuit board) of the transistor (e.g., source/drain) ports on one circuit board side. For example, the cable may be connected or is connected with or without further interconnected elements (e.g., a balun) to transmitting coils (e.g., 108 and/or 106) of the MRT (101).

FIG. 5 depicts a through-view of the top and bottom of a circuit board having four (EPC2010) assemblies on the top (e.g., each with a plurality of transistors and/or drain-and-source ports). On one circuit board side, an output line or cable VI runs parallel at least in sections (e.g., ten parallel, mutually connected loops run from left to right and right to left) to the connections Vb (e.g., running on the other side of the circuit board) of the transistor (e.g., source/drain) ports. The cable may be connected or is connected with or without further interconnected elements (e.g., a balun) to transmitting coils (e.g., 108 and/or 106) of the MRT (101).

For example, the output (e.g., balanced) of a power electronic unit LBE may be constructed with two ports (+, −) on two opposing sides of the power electronic unit LBE, or with two ports (+, −) on the same side of the power electronic unit.

For example, the load impedance of a transistor may be 12.5 ohm (e.g., in a push-pull application).

For example, the output impedance of the power electronic unit may be 50 ohm.

For example, the output impedance of the power electronic unit may be transformed from 50 ohm to the load impedance of a transistor of 12.5 ohm (e.g., using a transformer with a winding ratio of 2:1 of the amplifier side to the output side).

One advantage of the present embodiments may be a higher matching impedance and/or a lower output capacitance. Distribution over the entire chip may be more homogeneous than in other solutions and less susceptible to thermal hotspots.

For example, according to the present embodiments, it is possible to implement two-layer printed circuit boards (e.g., 2-layer pcb) for packages (e.g., flip chip packages) with fewer or no matching elements.

RFPAs for MRTs 101 may be used based on conventional approaches with packaged transistors.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A power electronic unit for an amplifier of an imaging magnetic resonance tomography (MRT) system, the power electronic unit comprising:
   a printed circuit board; and
   a plurality of transistors arranged on the printed circuit board,
   wherein ports of transistors of the plurality of transistors are connected together by electrically conductive connections,
   wherein the plurality of transistors is arranged on one side of the printed circuit board, and wherein an output line or cable runs on a side opposing the one side of the printed circuit board and is connectable to transmitting coils of the MRT system, wherein the output line or the cable is parallel to the electrically conductive connections at least in sections.

2. The power electronic unit of claim 1, wherein the output line or cable is connectable to the transmitting coils via further interconnected elements, wherein the further interconnected elements include a balun.

3. The power electronic unit of claim 1, wherein source ports of a first subset of transistors of the plurality of transistors are connected together by the electrically conductive connections, drain ports of a second subset of transistors of the plurality of transistors are connected together by the electrically conductive connections, or a combination thereof.

4. The power electronic unit of claim 3, wherein, in connections between the source ports of the first subset of transistors, currents run antiparallel to currents in connections between the drain ports of the second subset of transistors.

5. The power electronic unit of claim 3, wherein the source ports of the plurality of transistors are connected together.

6. The power electronic unit of claim 1, wherein the plurality of transistors is arranged on the printed circuit board without bonding ports.

7. The power electronic unit of claim 1, wherein a load impedance of a transistor of the plurality of transistors is 12.5 ohm.

8. The power electronic unit of claim 7, wherein the load impedance of the transistor is 12.5 ohm in a push-pull application.

9. The power electronic unit of claim 1, wherein an output impedance of the power electronic unit is 50 ohm.

10. The power electronic unit of claim 1, wherein an output impedance of the power electronic unit is transformed from 50 ohm to a load impedance of a transistor of the plurality of transistors of 12.5 ohm.

11. The power electronic unit of claim 10, wherein the output impedance is transformed with a transformer having a winding ratio of 2:1 of an amplifier side to an output side.

12. The power electronic unit of claim 1, wherein the printed circuit board includes two modules, wherein each module comprises transistors of the plurality of transistors mounted on a same side of the printed circuit board.

13. The power electronic unit of claim 1, wherein the printed circuit board includes at least four modules, wherein each module comprises transistors of the plurality of transistors all mounted on a same side of the printed circuit board.

14. The power electronic unit of claim 1, wherein the printed circuit board includes four modules, wherein each module comprises transistors of the plurality of transistors all mounted on a same side of the printed circuit board, wherein a spacing between each pair of adjacent modules of the four modules is greater in one direction than in the direction perpendicular thereto.

15. The power electronic unit of claim 1, wherein the printed circuit board includes a plurality of modules, each module of the plurality of modules including transistors of the plurality of transistors, three internal drain ports, and two internal source ports.

16. The power electronic unit of claim 1, further comprising a 1:1 or 2:1 transformer.

17. The power electronic unit of claim 1, wherein an output of the power electronic unit comprises two ports formed at two opposing sides of the power electronic unit.

18. The power electronic unit of claim 1, wherein an output of the power electronic unit comprises two ports formed at a same side of the power electronic unit.

19. The power electronic unit of claim 1, wherein the power electronic unit is a high frequency (HF) amplifier arrangement or part of an HF amplifier arrangement of the MRT system.

* * * * *